United States Patent [19]

Suenaga

[11] Patent Number: 4,772,100
[45] Date of Patent: Sep. 20, 1988

[54] LIQUID CRYSTAL DISPLAY DEVICE HAVING CIRCUIT BOARDS EXTENDING ALONG SEGMENT AND COLUMN ELECTRODE DIRECTIONS

[75] Inventor: Hideo Suenaga, Tokyo, Japan

[73] Assignee: Oki Electric Industry Co. Ltd., Tokyo, Japan

[21] Appl. No.: 105,185

[22] Filed: Oct. 6, 1987

[30] Foreign Application Priority Data

Oct. 9, 1986 [JP] Japan ............................. 61-154436
Nov. 14, 1986 [JP] Japan ............................. 61-271610

[51] Int. Cl.⁴ ........................................... G02F 1/13
[52] U.S. Cl. ..................................... 350/336; 350/333
[58] Field of Search .................. 350/333, 334, 336; 340/765, 784

[56] References Cited

U.S. PATENT DOCUMENTS

| | | | |
|---|---|---|---|
| 3,689,131 | 9/1972 | Klein et al. ....................... | 350/336 X |
| 4,431,270 | 2/1984 | Funada et al. .................... | 350/336 X |
| 4,474,432 | 10/1984 | Takamatsu et al. ............. | 350/336 X |
| 4,586,789 | 5/1986 | Kishimoto et al. .............. | 350/333 X |
| 4,629,289 | 12/1986 | Streit ................................. | 350/336 |
| 4,640,581 | 2/1987 | Nakanowatari et al. ........ | 350/336 X |
| 4,655,551 | 4/1987 | Washizuka et al. ............. | 350/336 X |

FOREIGN PATENT DOCUMENTS

| | | | |
|---|---|---|---|
| 0022934 | 1/1981 | European Pat. Off. ............ | 350/336 |
| 0133528 | 7/1984 | Japan .................................. | 350/336 |

Primary Examiner—Stanley D. Miller
Assistant Examiner—Richard F. Gallivan
Attorney, Agent, or Firm—Spencer & Frank

[57] ABSTRACT

In a liquid crystal display device comprising a substantially rectangular liquid crystal display panel having segment electrodes provided along a first edge thereof and common electrodes provided along a second edge thereof orthogonal to the first edge, a segment circuit board extends along the first edge and is electrically connected with the segment electrodes, and a common circuit board extends along the second edge and is electrically connected with the common electrodes.

10 Claims, 8 Drawing Sheets

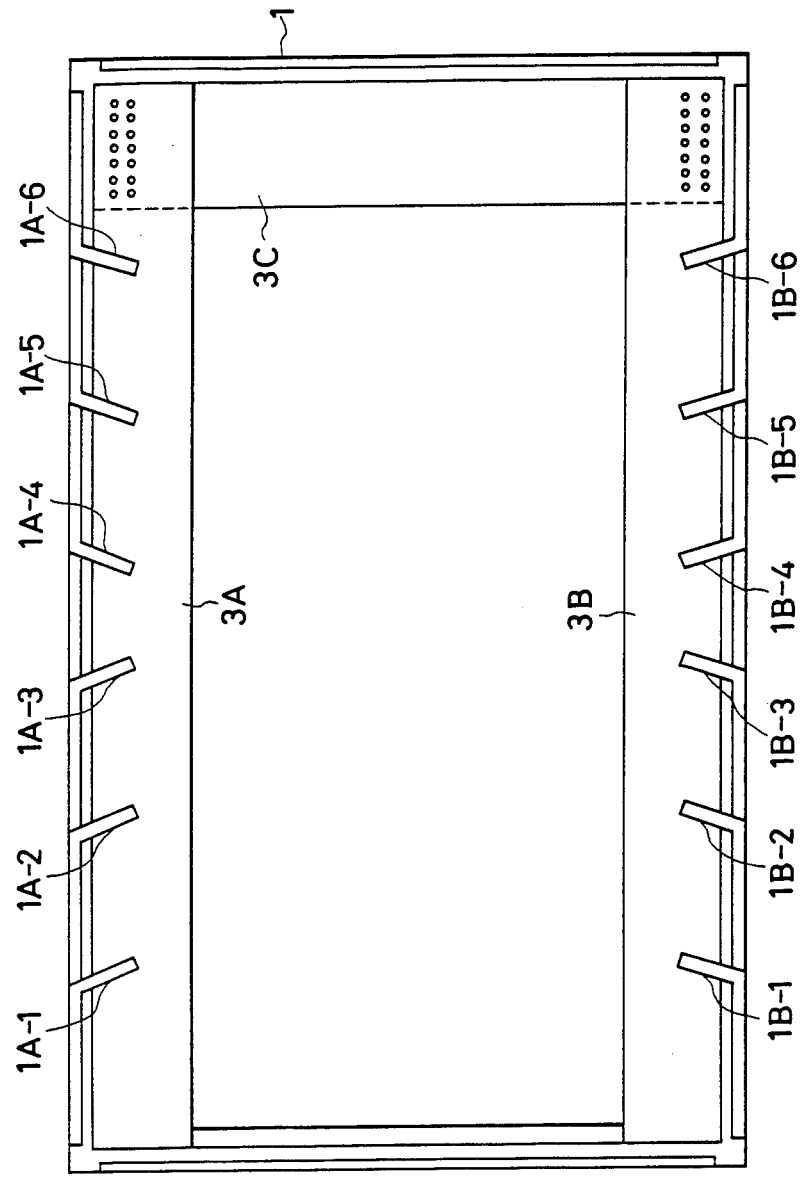

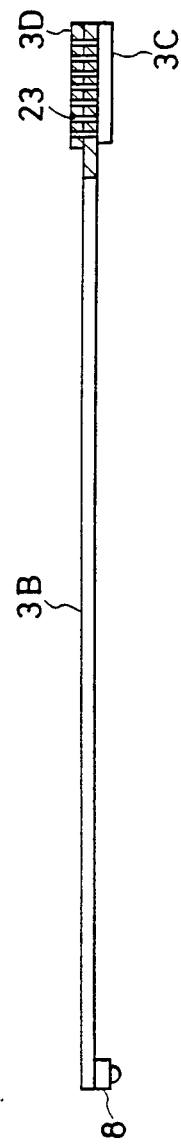
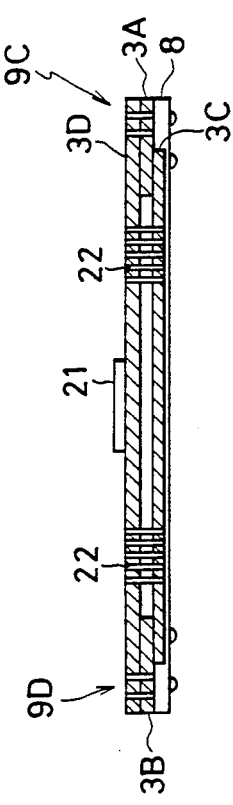

LIQUID CRYSTAL DISPLAY DEVICE HAVING CIRCUIT BOARDS EXTENDING ALONG SEGMENT AND COLUMN ELECTRODE DIRECTIONS

BACKGROUND OF THE INVENTION

The present invention relates to a liquid crystal display device.

FIG. 2 is a cross sectional view showing a liquid crystal display device in the prior art. It comprises a frame 1 and a liquid crystal panel 2 including a front glass sheet 2A and a rear glass sheet 2B. A printed circuit board 3 is provided, on which LSI (large scale integration) drivers for driving the liquid crystal panel are mounted. Interconnectors 4A and 4B interconnect the segment electrodes on the front glass sheet 2A and the segment terminals on the printed circuit board 3. The interconnectors 4A and 4B comprises a main body of insulating rubber and pieces of conductive rubber embedded to penetrate vertically as seen in the figure and arranged along the length of the interconnectors. The interconnectors are of compressive type and electrically connect, when compressed by for example about 20% between the front glass sheet and the printed circuit board, the electrodes with which the front and rear surfaces thereof are in contact. The frame 1 holds the interconnectors 4A, 4B in the compressed state.

Recently, development is made to enlarge the display area of the liquid crystal display device. With the above structure, the printed circuit board have a larger size as the display area is enlarged. As a result, the cost of the device is increased.

Moreover, as an illuminating device is disposed between the liquid crystal display panel and the printed circuit board the interconnectors had to be thick (the thickness is the dimension in the vertical direction in the figure). As a result, the interconnectors may be twisted or distorted and proper contact may not be achieved.

Furthermore, special apparatus, such as special wire bonders, for mounting a number of circuit elements on the large sized printed circuit board was required. This problem is becoming more serious as the size of the printed circuit board is increased.

SUMMARY OF THE INVENTION

An object of the invention is to provide a liquid crystal display device in which the size of the printed circuit board can be reduced, and the thickness of the interconnectors can also be reduced.

According to the invention, there is provided a liquid crystal display device comprising
a substantially rectangular liquid crystal display panel having segment electrodes provided along a first edge thereof and common electrodes provided along a second edge thereof orthogonal to the first edge,
a segment circuit board extending along the first edge and electrically connected with the segment electrodes, and
a common circuit board extending along the second edge and electrically connected with the common electrodes.

In the above configuration, the printed circuit boards can be made thin so that their area can be reduced. Moreover, since the printed circuit boards are provided to extend along the edges of the liquid crystal display panel, the illuminating device need not be disposed between the liquid crystal display panel and the printed circuit boards but it can be disposed at the back of the printed circuit boards. Accordingly, the interconnectors for interconnecting the liquid crystal display panel and the printed circuit boards can be made thin.

BRIEF DESCRIPTION OF THE EMBODIMENT

FIG. 3 is a bottom view of the liquid crystal display device of FIG. 1, with the illuminating device removed.

FIG. 10 shows a cross section along line X—X in FIG. 9.

FIG. 11 shows a cross section along line Y—Y in FIG. 9.

DETAILED DESCRIPTION OF THE EMBODIMENTS

Figure 1:
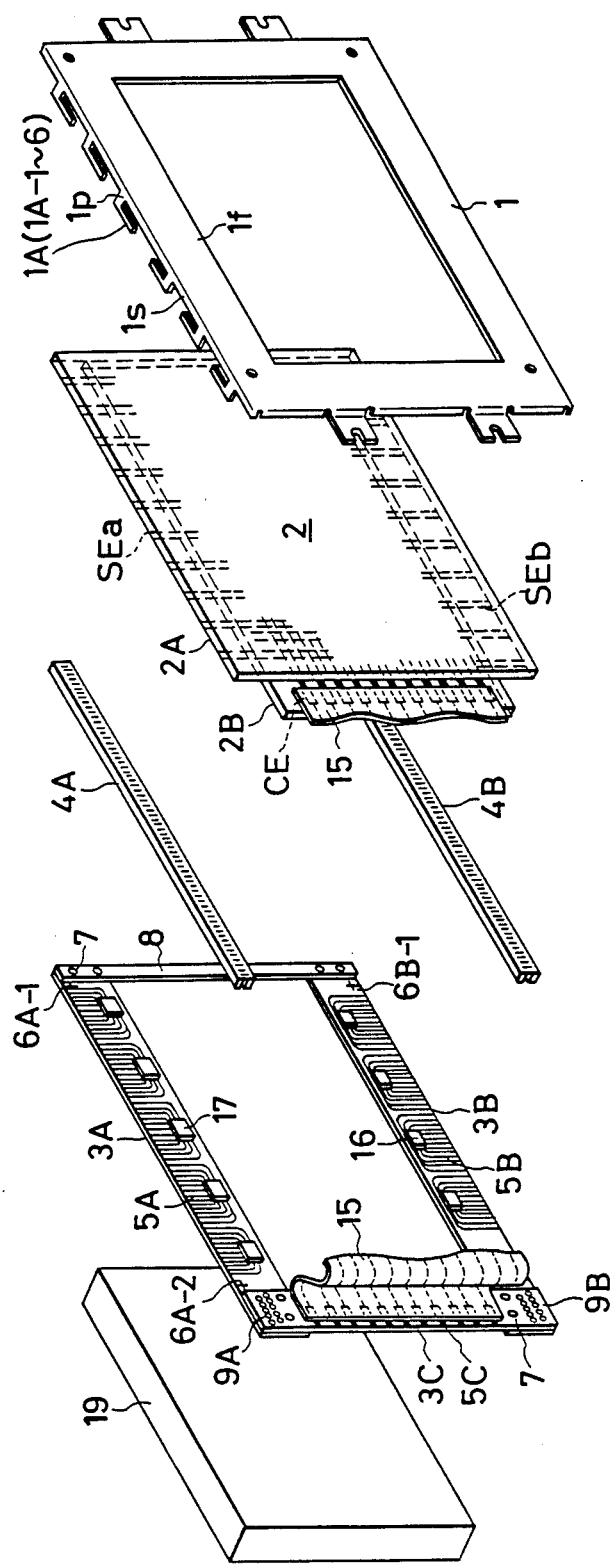
FIG. 1 is an exploded perspective view showing a liquid crystal display device of an embodiment of the invention.
Figure 2:
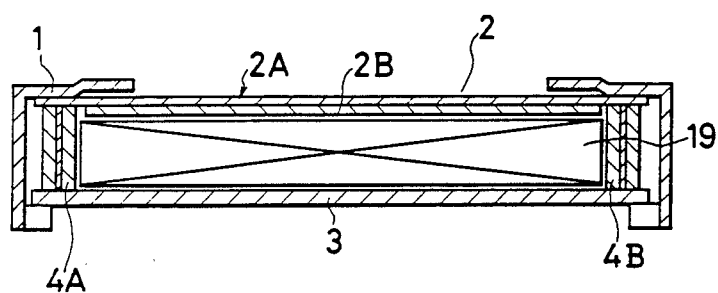
FIG. 2 is a cross sectional view showing a liquid crystal display device in the prior art.
Figure 4:
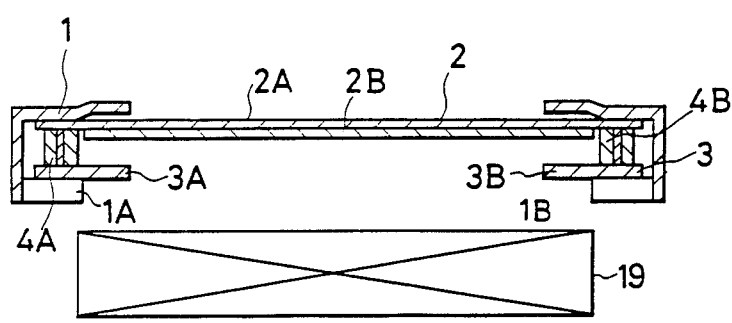
FIG. 4 is a cross sectional view of the liquid crystal display device of FIG. 1.
Figure 5A:
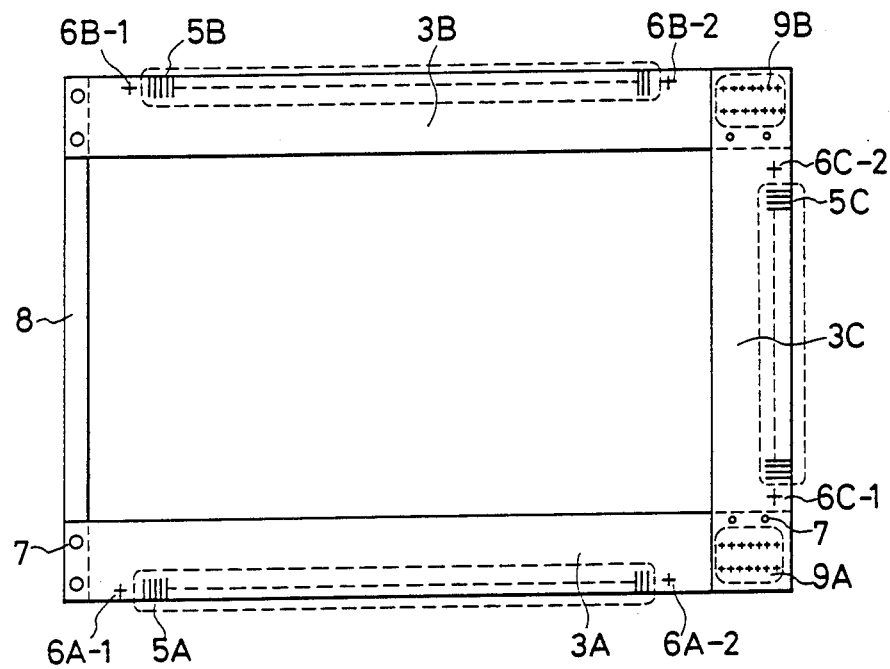
FIGS. 5A and 5B are a plan view and a side view of a printed circuit board assembly forming part of the liquid crystal display device of FIG. 1.
Figure 5B:

Referring now more particularly to FIG. 1, FIG. 3 and FIG. 4, there is shown a liquid crystal display device of an embodiment of the invention. It comprises a frame 1 and a liquid crystal display panel which includes a front glass sheet 2A and a rear glass sheet 2B. Segment electrodes are provided on the rear surface of the front glass sheet 2A along opposite and parallel edges (upper and lower edges as seen in FIG. 1). Common electrodes are provided on the front surface of the rear glass sheet along an edge normal to the above-mentioned edges of the front glass sheet 2A.

A printed circuit board assembly 3 is formed of a pair of segment circuit board 3A, 3B and a common circuit board 3C. Each end of the common circuit board 3C is laid on one end of each of the segment circuit boards 3A, 3B and fixed to it. In the illustrated embodiment, the common circuit board 3C is positioned in front of (closer to the liquid crystal display panel than) the segment circuit boards 3A, 3B.

Segment terminals 5A, 5B are provided on the segment circuit boards 3A, 3B in alignment with the segment electrodes on the front glass sheet 2A. Common terminals 5C are provided on the common circuit board 3C in conformity with the common electrodes on the rear glass sheet 2B. Reference marks 6A-1, 6A-2 on the segment circuit board 3A and reference marks 6B-1, 6B-2 on the segment circuit board 3B are used for alignment of the printed circuit board assembly with the liquid crystal panel. The reference marks 6C-1, 6C-2 on the common circuit board 3C are used for registration of the common circuit board 3C with one end of a tape connector 15 to be described later.

By use of the reference marks, the segment electrodes SEa and SEb on the front glass sheet 2A and the segment terminals 5A, 5B on the segment circuit boards 3A, 3B are registered or aligned for one-to-one connection by the interconnectors 4A, 4B.

Ends of the segment circuit boards 3A, 3B, opposite to those connected to the comon circuit board 3C, are connected to respective ends of a support member 8.

Figure 6A:
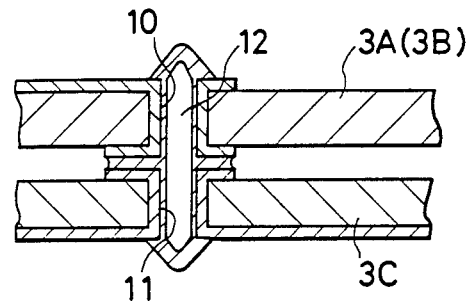
FIGS. 6A and 6B are cross-sectional views showing different examples of interconnection between the printed circuit boards.
Figure 6B:
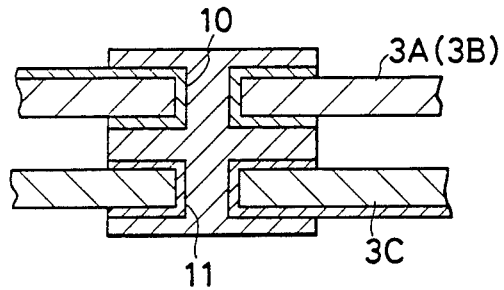

The common circuit board 3C and the segment circuit boards 3A, 3b are electrically interconnected at connection points 9A, 9B. FIGS. 6A, 6B show different examples of the connection at the connection points. In the example shown in FIG. 6A, metal pins 12 are made to extend through throughholes 10, 11 formed in the segment circuit boards 3A, 3b and the common circuit board 3C and soldered. In the example of FIG. 6B, solder layers are formed on the lands of the throughholes in the segment circuit boards and common circuit board and are heat-pressed.

The common terminals 6C on the common circuit board 3C are connected to one end of a flexible tape connector 15 of the heat-seal type, i. e., of the type achieving electrical connection by heat sealing (or heat-pressing). The other end of the tape connector 15 is connected to the common electrodes on the rear glass sheet 2B. Examples of the connecting medium by means of heat-pressing that can be used are Hitachi anisotropic conductivity film "Anisorum AC-1052" of Hitachi Kasei Kabushiki Kaisha or anisotoropic conductivity film CP-1030 of Sonychemical.

The frame 1 comprises a front part 15 having an opening, a side part is extending backward from the fringes of the front part 1f, tugs 1p extending further backward from the rear edges of the side part 1s, and nails 1A-1 to 1A-6 and 1B-1 to 1B-6 extending from the side edges of the tugs 1p toward the interior of the liquid crystal display panel and abutting with the rear surfaces of the segment circuit boards. The nails 1A-1 to 1A-6 and 1B-1 to 1B-6, and the frame front part 1f, hold the liquid crystal panel and the printed circuit board between them with the interconnectors being compressed by about 20%. Before the assembly, the nails 1A-1 to 1A-6 and 1B-1 to 1B-6 extend on the same plane as the tugs 1p. During the assembly, the liquid crystal panel and the printed circuit boards are superimposed and the interconnectors between them are compressed, when the bending is made along the boundaries between the tugs and the nails so that the nails extend toward the interior of the liquid crystal panel.

It is desirable that the nails extend beyond (toward the inside) the interconnectors so that more stable support of the interconnectors can be achieved.

The interconnectors can comprise an elongated main body formed of an insulating rubber and a multiple of conductive rubber pieces penetrating vertically through the insulating rubber body and arranged along the length of the insulating rubber body. This will enable cost reduction compared with the situation where tape connectors must be used for these parts. The common circuit board 3C can be fixed by use of spacers between the common circuit board 3C and the frame 1.

An illuminating device 19 is used as a back light for illuminating the effective display area of the liquid crystal display panel 2 and disposed at the back of the printed circuit board assembly 3. In the past, the illuminating device had to be disposed between the liquid crystal display panel 2 and the printed circuit board assembly 3 so that the interconnectors 4A, 4B had to be thick with the result that the electrical connection may be unsuccessful or unstable. According to the invention, the illuminating device 19 can be disposed at the back of the printed circuit board assembly 3, so that the interconnectors 4A, 4B can be made thin, with the result that the electrical connection between the liquid crystal display panel 2 and the printed circuit board assembly 3 by means of the interconnectors is stabilized and improved.

Figure 7:
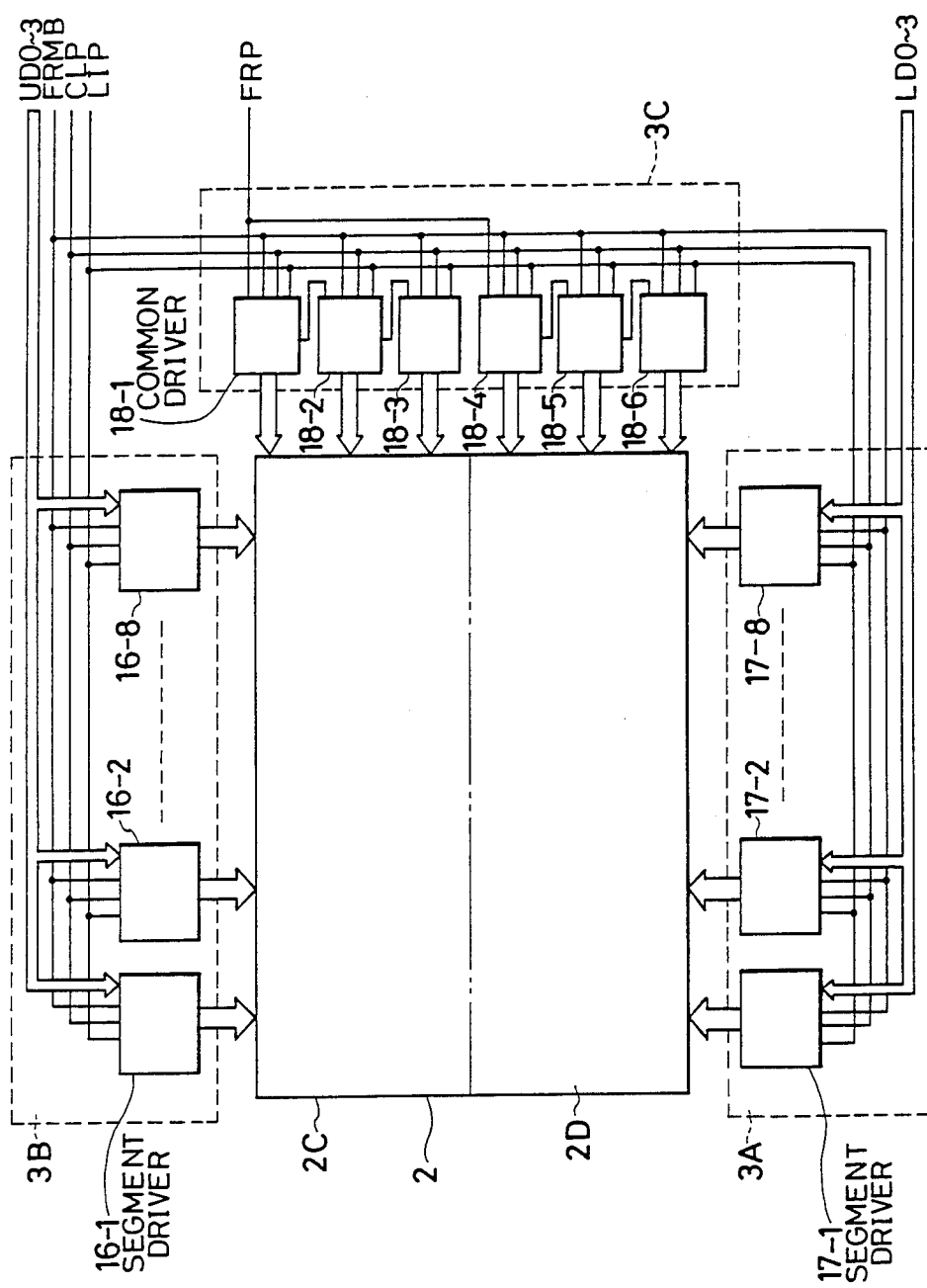
FIG. 7 is a block diagram showing electrical interconnection between various circuit components of the liquid crystal display device of FIG. 1.

FIG. 7 shows an example of the illuminating device 19. It comprises a pair of fluorescent lamps 19a, a light guide 19b and a diffusion plate 19c.

Figure 8:
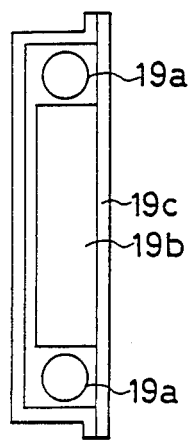
FIG. 8 is a schematic cross sectional view showing an example of the illuminating device.

FIG. 8 shows an example of electrical connection of components mounted on the printed circuit board assembly 3 and the liquid crystal display panel 2. The liquid crystal display device performs display by 640×400 dots. There are two segment circuit boards 3A, 3B and one common circuit board 3C. The liquid crystal panel 2 are divided into two halves 2C and 2D. The upper half 2C has 640 segment electrodes and 200 common electrodes. The segment electrodes of the upper half 2C are connected to segment drivers 16-1 to 16-8 mounted on the segment circuit board 3B. The lower half 2D of the liquid crystal panel 2 has 640 segment electrodes and 200 common electrodes. The segment electrodes are connected to segment drives 17-1 to 17-8 mounted on the segment circuit board 3A. The common electrodes of the upper and lower halves are connected to common drivers 18-1 to 18-6 mounted on the common circuit board 3C. The segment drivers can be LSIs "MSM 5299" of Oki Electric Industry Co., Ltd. of Japan. The common drivers can be LSIs "MSM 5298" of Oki Electric Industry Co., Ltd. of Japan.

As has been described according to the invention, the printed circuit board assembly 3 comprises elongated printed circuit boards 3A, 3B and 3C. The total area of these printed circuit boards can be made smaller than the conventional single-piece printed circuit board. Accordingly, the cost of the liquid crystal display device can be reduced. This effect is significant where the display area is large.

Moreover, the illuminating device can be disposed at the back of the printed circuit board assembly, so that the thickness of the interconnectors can be reduced. As a result, the electrical connection between the liquid crystal display panel and the printed circuit board is stabilized and improved.

The segment circuit boards can be standardized. First, identical printed circuit boards can be used for both of the segment circuit boards 3A and 3B. Secondly, identical printed circuit boards can be used for liquid crystal display panels having different dot sizes or display areas if the electrode pitches are designed to be identical.

When a defect is found at inspection in one of the printed circuit boards, it is only necessary to replace the particular printed circuit board having been found defective.

In the above embodiment, the liquid crystal display device is assumed to be of the simple matrix type of TN (twisted nematic) system. But the invention can be applied to any other liquid crystal display device having transparent sheets of for example glass, plastic or the like and having electrodes along its edges.

In the embodiment described, a pair of segment circuit boards are provided to extend along opposite edges of the liquid crystal panel. But only one segment circuit board may be provided to extend along one edge of the liquid crystal panel. This arrangement is practical where the number of display dots is small or where the display device is of the active matrix type.

Figure 9:
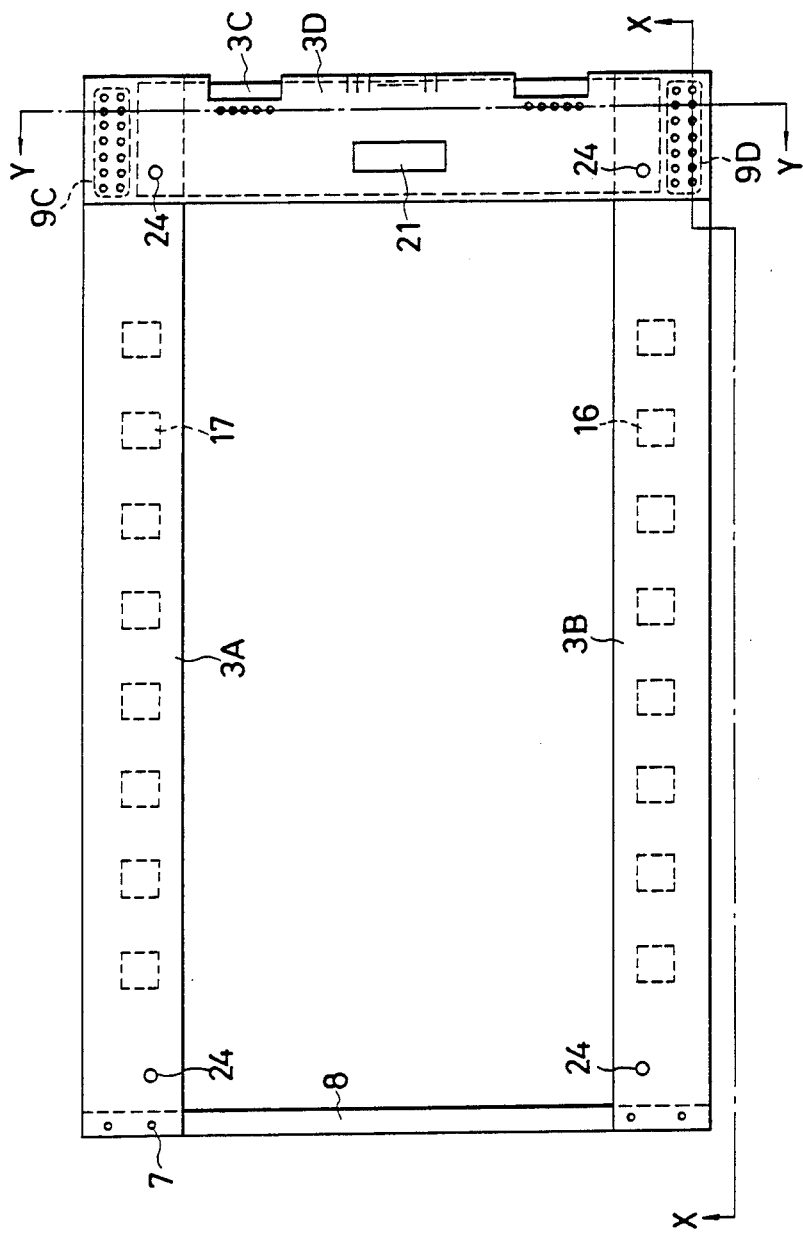
FIG. 9 is a plan view showing another example of printed circuit board assembly.

FIG. 9 shows another embodiment of the invention. In this embodiment, a control circuit board 3D is provided in addition to the segment circuit boards 3A, 3B and the common circuit board 3C. Mounted on this control circuit board 3D are control circuit elements 21. In the illustrated embodiment, the control circuit board 3D is disposed at the rear of the segment circuit boards 3A, 3B, i.e., on the opposite side to the common circuit board 3C. Each end of the control circuit board 3D are superimposed with respective one end of the segment circuit board 3A, 3B and fixed thereto together with the common circuit board 3C. The segment circuit boards 3A, 3B and the control circuit board 3D are electrically connected, at connection points 9C, 9D, by means of pins 23 extending through throughholes aliged with each other. The common circuit board 3C and the control circuit board 3D are electrically connected by exposed pins 22 connected to bonding pads at the edges of these boards 3C and 3D.

What is claimed is:

1. A liquid crystal display device comprising
   a substantially rectangular crystal display panel having segment electrodes provided along a first edge thereof and common electrodes provided along a second edge thereof orthogonal to the first edge,
   a segment circuit board extending along the first edge and electrically connected with the segment electrodes, and
   a common circuit board extending along the second edge and electrically connected with the common electrodes.

2. A liquid crystal display device according to claim 1, wherein
   the segment electrodes on the liquid crystal panel are formed on a surface of the liquid crystal panel facing the segment circuit board,
   terminals corresponding to the segment electrodes are formed on the segment circuit board at the respectively confronting positions, and
   the segment electrodes and the corresponding terminals are electrically connected by a resilient interconnector interposed in a compressed state.

3. A liquid crystal display device according to claim 1, wherein one end of the segment circuit board and one end of the common circuit board are superimposed and fixed to each other.

4. A liquid crystal display device according to claim 1, wherein the segment circuit board has segment driver circuit elements mounted thereon and the common circuit board has common driver circuit elements mounted thereon.

5. A liquid crystal display device according to claim 1, wherein segment electrodes are also provided along a third edge of the liquid crystal display panel parallel with the first edge,
   an additional segment circuit board is provided to extend along the third edge, and
   one end of the segment circuit board along the third edge is superimposed with and fixed to the common circuit board.

6. A liquid crystal display device according to claim 1 further comprising a frame having
   a frame front part having an opening,
   a frame side part extending backward from the edges of the frame front part,
   tugs protruding backward from the rear ends of the frame side part, and
   nails extending from the side edges of the tugs toward the interior of the liquid crystal display panel and abutting the rear surfaces of the segment circuit board to hold the segment circuit board and the liquid crystal panel between the nails and the frame front part.

7. A liquid crystal display device according to claim 1, wherein the common circuit board is disposed closer to the liquid crystal panel than the segment circuit board.

8. A liquid crystal display device according to claim 7, further comprising a control circuit board on the side of the segment circuit board opposite to the common circuit board, one end of the control circuit board being superimposed with the segment circuit board and fixed thereto.

9. A liquid crystal display device according to claim 8 whereint the control circuit board has control circuit elements mounted thereon, and is electrically connected with the segment circuit board and the common circuit board.

10. A liquid crystal display device according to claim 1 further comprising a tape connector interconnecting the common electrodes of the liquid crystal panel and the common circuit board.

* * * * *